(12) United States Patent
Miura et al.

(10) Patent No.: US 8,085,116 B2
(45) Date of Patent: Dec. 27, 2011

(54) ELASTIC WAVE DEVICE WITH A DIELECTRIC LAYER ON THE COMB-SHAPED ELECTRODES

(75) Inventors: Michio Miura, Kawasaki (JP); Suguru Warashina, Kawasaki (JP); Takashi Matsuda, Kawasaki (JP); Shogo Inoue, Kawasaki (JP); Kazunori Inoue, Kawasaki (JP); Satoru Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 362 days.

(21) Appl. No.: 12/408,188

(22) Filed: Mar. 20, 2009

(65) Prior Publication Data

US 2009/0267707 A1 Oct. 29, 2009

(30) Foreign Application Priority Data

Mar. 24, 2008 (JP) .................. 2008-076248

(51) Int. Cl.
*H03H 9/54* (2006.01)
*H03H 9/145* (2006.01)
*H03H 9/25* (2006.01)

(52) U.S. Cl. ...... 333/193; 333/133; 333/195; 310/313 B

(58) Field of Classification Search .......... 333/193–196, 333/133; 310/312, 313 B, 313 D
See application file for complete search history.

(56) References Cited

U.S. PATENT DOCUMENTS

| | | | | |
|---|---|---|---|---|
| 4,243,960 | A | * | 1/1981 | White et al. ................... 333/196 |
| 5,631,515 | A | * | 5/1997 | Mineyoshi et al. ........ 310/313 B |
| 6,121,860 | A | * | 9/2000 | Tsutsumi et al. ............. 333/195 |
| 6,522,219 | B2 | * | 2/2003 | Takamiya et al. ............. 333/133 |
| 7,345,400 | B2 | * | 3/2008 | Nakao et al. ............. 310/313 A |
| 7,453,334 | B1 | * | 11/2008 | Abbott et al. ................. 333/195 |
| 7,576,471 | B1 | * | 8/2009 | Solal ......................... 310/313 B |
| 2003/0117240 | A1 | * | 6/2003 | Inoue et al. .................... 333/195 |
| 2007/0018755 | A1 | * | 1/2007 | Mayer et al. .................. 333/193 |
| 2007/0159026 | A1 | * | 7/2007 | Kando ...................... 310/313 D |
| 2008/0061657 | A1 | * | 3/2008 | Matsuda et al. ............. 310/334 |

FOREIGN PATENT DOCUMENTS

| | | | | |
|---|---|---|---|---|
| JP | 2-250414 | | * 10/1990 | ..................... 333/193 |
| JP | 3-158014 | | * 7/1991 | ..................... 333/193 |
| JP | 07-15272 | A | 1/1995 | |
| JP | 10-22765 | | * 1/1998 | |
| JP | 11-298286 | A | 10/1999 | |
| JP | 2000-183681 | | * 6/2000 | |

\* cited by examiner

*Primary Examiner* — Barbara Summons
(74) *Attorney, Agent, or Firm* — Arent Fox LLP

(57) ABSTRACT

An elastic wave device is described which includes a piezoelectric substrate, comb-shaped electrodes having teeth electrodes that are disposed so as to face each other on the piezoelectric substrate, a non-overlapping area in which the teeth electrodes of the comb-shaped electrodes do not overlap each other, and a overlapping area in which the teeth electrodes overlap each other and the velocity of sound is higher than that in the non-overlapping area.

12 Claims, 17 Drawing Sheets

ELASTIC WAVE DEVICE WITH A DIELECTRIC LAYER ON THE COMB-SHAPED ELECTRODES

CROSS-REFERENCE TO RELATED APPLICATION

This application is based upon and claims the benefit of priority of the prior Japanese Patent Application No. 2008-76248, filed on Mar. 24, 2008, the entire contents of which are incorporated herein by reference.

FIELD

An aspect of this invention relates to an elastic wave device used for a filter device for processing radio frequency signals or an oscillator for producing a reference signal in a television image receiver, a cellular phone unit or the like, for example.

BACKGROUND

An elastic surface acoustic wave (SAW) device has been well known as a device to which elastic waves are applied. This SAW device is used for various kinds of circuits in a device for processing a radio signal in a frequency band of 45 MHz to 2 GHz. For example, SAW devices have been known for use in a transmission band pass filter, a reception band pass filter, a local oscillation filter, an antenna duplexer, an IF filter, an FM modulator, etc.

In connection with the enhancement in performance of cellular phones, etc., improvements of various characteristics such as reduction of loss within the band, high suppression at the outside of the band, enhancement of temperature stability, etc., and miniaturization of the device size have been recently required in SAW devices used as band pass filters. Particularly, the reduction of loss is related to the problem of increasing the driving time of cellular equipment which has been recently problematic, and it is a permanent object required to cellular equipment parts.

SUMMARY

An elastic wave device according to the present embodiment has a piezoelectric substrate, comb-shaped electrodes arranged so as to face each other on the piezoelectric substrate, a non-overlap area in which electrode fingers possessed by the respective comb-shaped electrodes do not overlap each other and a overlap area in which the electrode fingers possessed by the respective comb-shaped electrodes overlap each other and the velocity of sound is higher than that of the non-overlap area.

Additional objects and advantages will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

DESCRIPTION OF EMBODIMENTS

Figure 1:
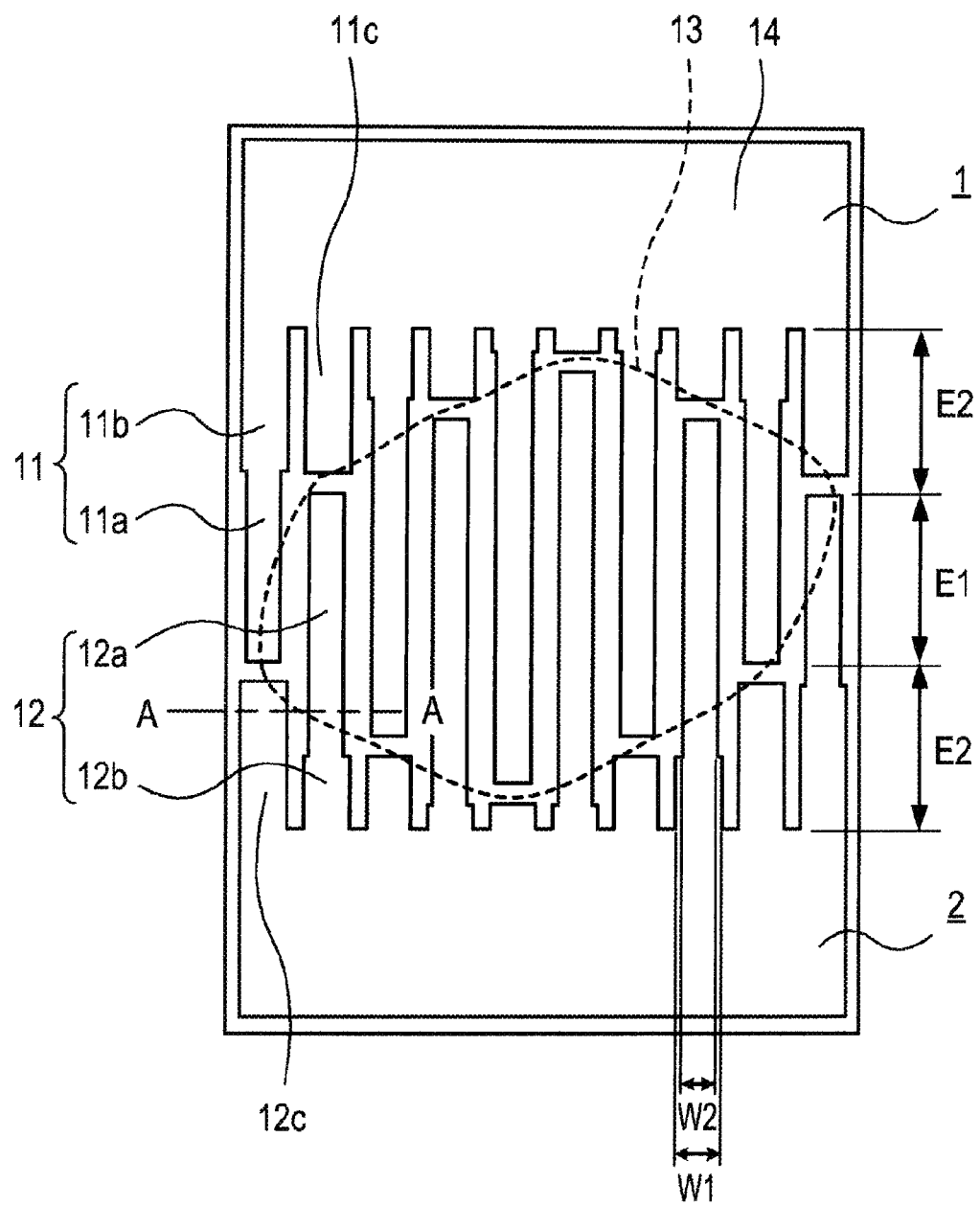
FIG. 1 is a plan view illustrating an elastic wave element according to an embodiment.

In an elastic wave device using the comb-shaped electrodes, the overlap width of the electrodes may be weighted to suppress the spurious response based on a high-order transverse mode, thereby adjusting an electromechanical coupling coefficient or the like. In general, such weighting is called "apodizing weighting". The elastic wave device in which the apodizing weighting is applied to the comb-shaped electrodes has discontinuity in the propagation direction of the elastic wave, and thus the loss thereof increases frequently. Furthermore, with respect to one-port resonator containing comb-shaped electrodes and a reflector, there is a problem that the stop band thereof (a frequency range in which elastic waves are reflected from the electrodes) is higher than the resonance frequency, and thus the loss near the resonance frequency increases.

This embodiment has an object to implement an elastic wave device that can reduce the loss near the resonance frequency. Furthermore, this embodiment has another object to implement a filter, a communication module, and a communication device that is equipped with the elastic wave device as described above.

An elastic wave device according to this embodiment comprises a piezoelectric substrate and comb-shaped electrodes disposed so as to face each other on the piezoelectric substrate, wherein the comb-shaped electrodes have a non-overlap area in which adjacent electrodes do not overlap each other and a overlap area in which adjacent electrodes overlap each other, and the non-overlap area is formed so that the velocity of sound in the non-overlap area is lower than that in the overlap area.

According to this embodiment, the loss in the neighborhood of the resonance frequency is reduced.

Embodiment

1. Elastic Wave Device

An elastic wave device according to this embodiment has a piezoelectric substrate, such as a lithium niobate (LiNbO$_3$) substrate or the like, of a rotating Y plate, and comb-shaped electrodes formed on the piezoelectric substrate. The comb-shaped electrodes are formed of electrically conductive material such as copper (Cu) or the like. When the comb-shaped electrodes are subjected to apodizing weighting, the velocity of sound in an area in which the comb-shaped electrodes do not overlap each other (non-overlap area) is set to be lower than that in a portion in which the comb-shaped electrodes overlap each other (overlap area), whereby the loss near of the resonance frequency can be reduced. By reducing the velocity of sound in the non-overlap area of the comb-shaped electrodes, the stop band of the non-overlap area of the comb-shaped electrodes can be shifted to a lower frequency side as compared with the stop band of the overlap area, and thus the area near of the resonance frequency enters the stop band. As a result, the loss near the resonance frequency is reduced. A summary of this embodiment is described above, and the details of the elastic wave device of this embodiment will be described below.

FIG. 1 is a plan view illustrating the elastic wave device according to this embodiment. In FIG. 1, the elastic wave device has a first comb-shaped electrode 1 and a second comb-shaped electrode 2, each of which has a plurality of teeth (finger) electrodes arranged in a comb-shape. The plural teeth electrodes of the first comb-shaped electrode 1 and the plural teeth electrodes of the second comb-shaped electrode 2 are arranged to overlap one another. The first comb-shaped electrode 1 has first electrodes 11, and each of the first electrodes 11 has a small-width portion 11a and a large-width portion 11b. The second comb-shaped electrodes 2 has second electrodes 12, and each of the second electrodes 12 has a small-width portion 12a and a large-width portion 12b. The small-width portion 11a and the large-width portion 11b are formed integrally with each other, and the small-width portion 12a and the large-width portion 12b are formed integrally with each other. In this case, each of the small-width portions 11a and 12a has a width dimension W2. Also, each of the large-width portions 11b and 12b has a width dimension W1 which is larger than the width dimension W2. The counter electrodes 11c are arranged so as to face the small-width portions 12a, and the counter electrodes 12c are arranged so as to face the small-width portions 11a. In the following description, an area in which the adjacent first and second electrodes 11 and 12 overlap each other is referred to as an "IDT area" or "overlap area", and an area in which the adjacent first and second electrodes 11 and 12 do not overlap each other is referred to as a "dummy area" or "non-overlap area". Accordingly, in the elastic wave device illustrated in FIG. 1, the area surrounded by a frame line 13 is an IDT area, and the area 14 outside of the frame line 13 is a dummy area. The dimension E1 is the dimension (overlap width) of the IDT area 13 at the right end of FIG. 1, and the dimension E2 is the dimension of the dummy area 14 at the right end of FIG. 1.

As illustrated in FIG. 1, the apodizing weighting is applied to the comb-shaped electrodes 1 and 2 so that the overlap width E1 is varied in accordance with the place. Furthermore, in the comb-shaped electrodes 1 and 2, the width of the electrode in the IDT area 13 is set to be smaller than that in the dummy area 14 (W2<W1). With the construction as described above, the velocity of sound of elastic waves occurring in the dummy area 14 is reduced to be lower than the velocity of sound of elastic waves occurring in the IDT area 13. As such, the stop band in the dummy area 14 is shifted to a lower frequency side than the stop band in the IDT area 13. The mechanism of the stop band and the low frequency side shift will be described later.

Figure 2:
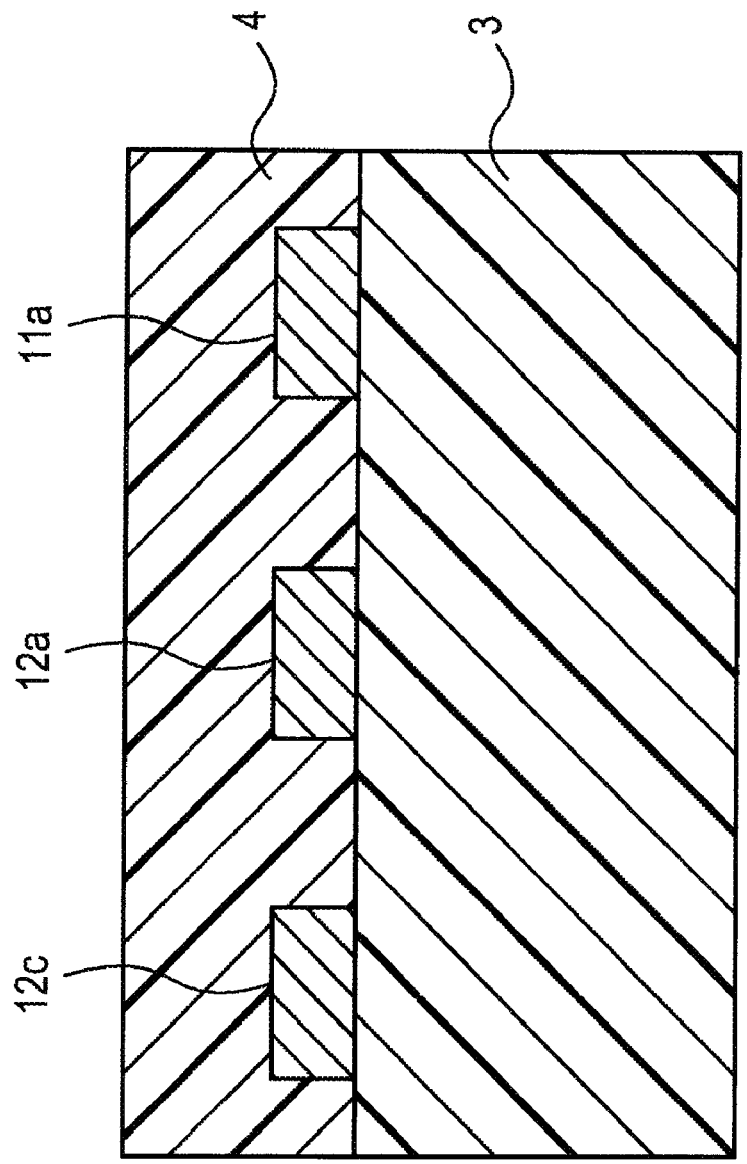
FIG. 2 is a overlap-sectional view of A-A portion in FIG. 1.

FIG. 2 is a overlap-sectional view of A-A portion of FIG. 1. As illustrated in FIG. 2, in the elastic wave device according to this embodiment, the comb-shaped electrodes 1 and 2, which are formed of Cu, are formed on the piezoelectric substrate 3, which are formed of LiNbO$_3$. The silicon oxide (SiO$_2$) film 4 is formed so as to cover the comb-shaped electrodes and 2. The elastic wave device of this embodiment is an elastic wave device using a Love wave which is a kind of surface elastic wave. The elastic wave device is not limited to the Love wave device. Other types of elastic wave devices may be used such as, for example, a boundary wave device.

Figure 3:
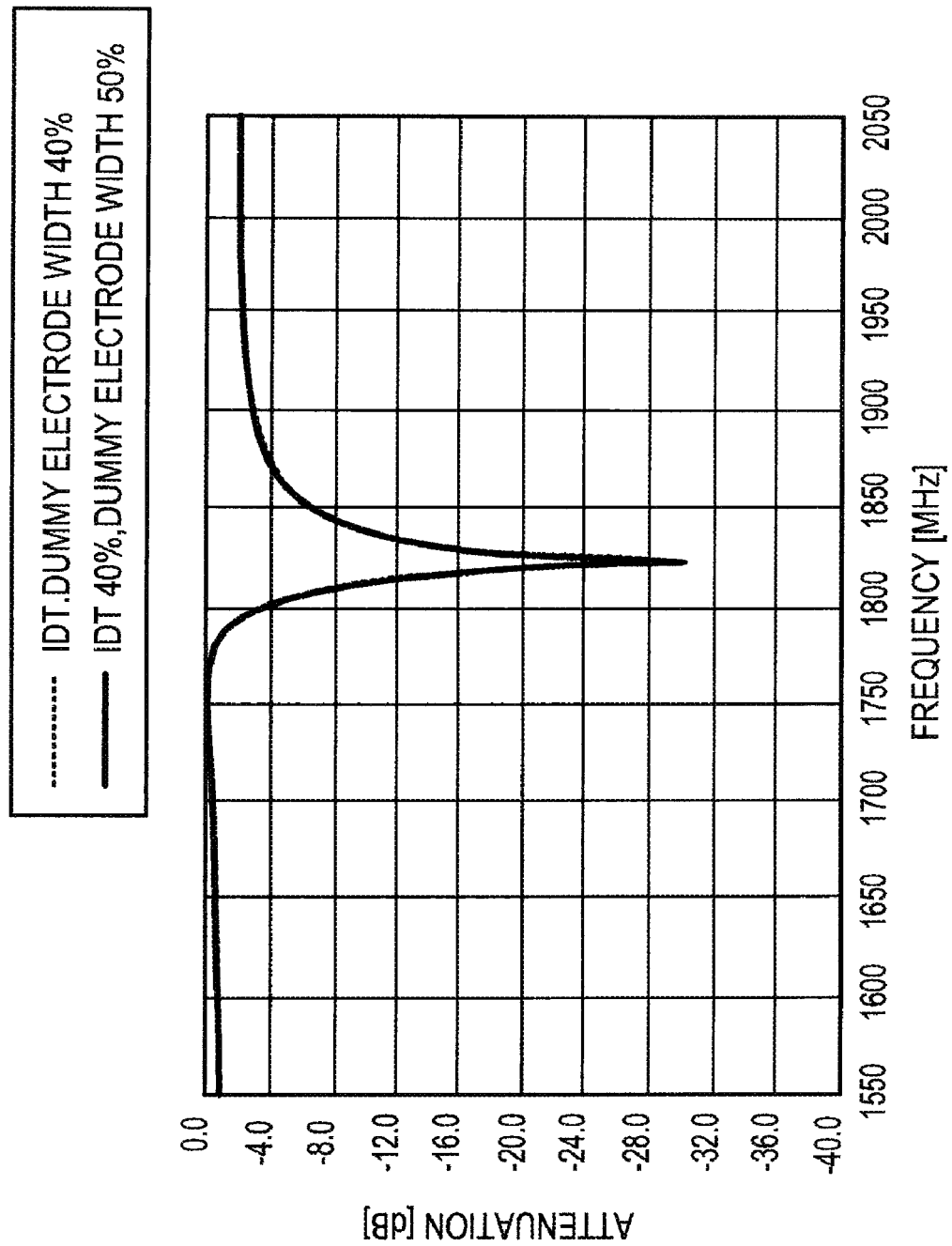
FIG. 3 is a characteristic diagram illustrating the relationship between the thickness of the electrodes in an IDT area and the thickness of the electrodes in a dummy area.
Figure 4:
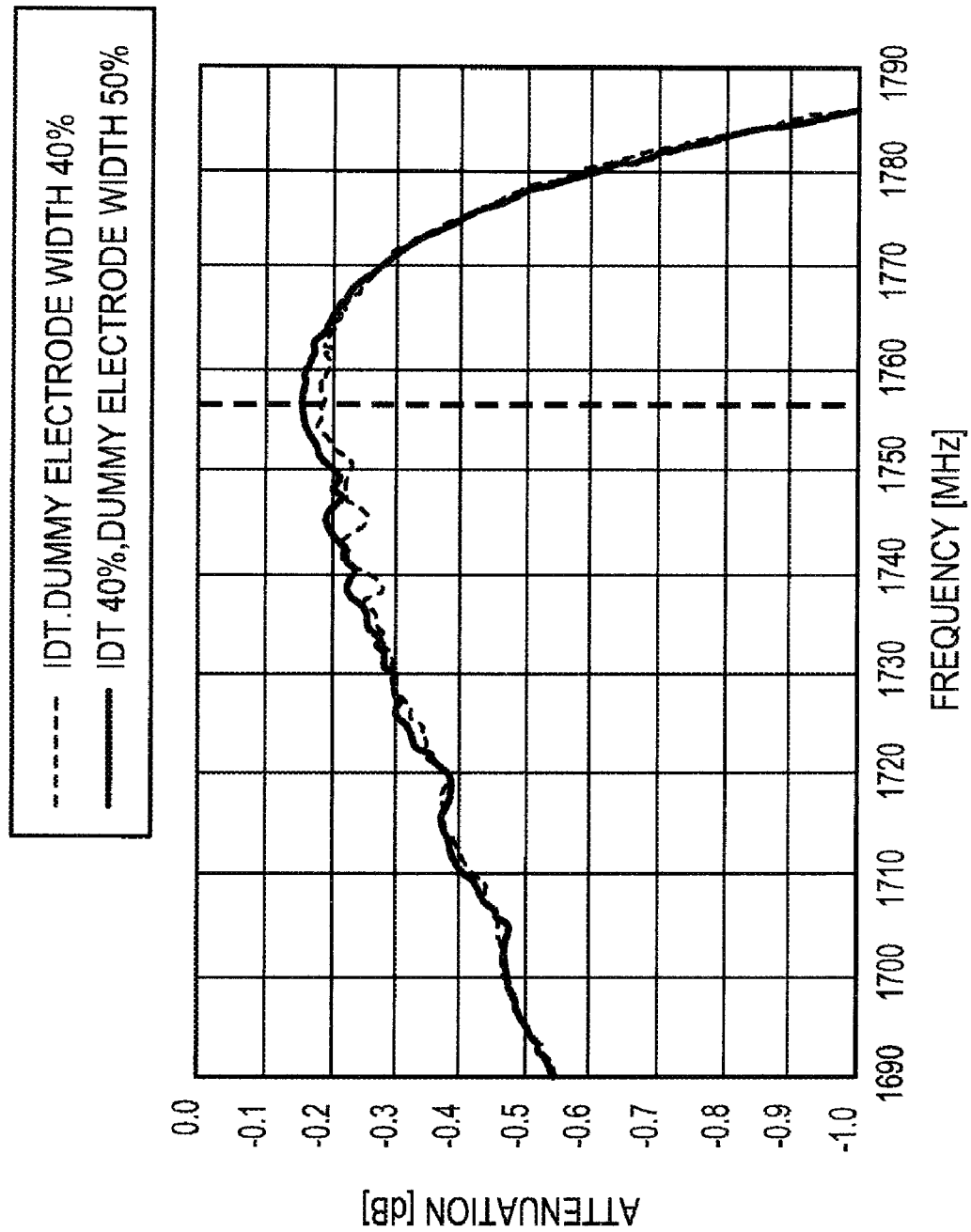
FIG. 4 is a characteristic diagram illustrating the relationship between the thickness of the electrodes in the IDT area and the thickness of the electrodes in the dummy area.

FIG. 3 is a frequency characteristic of a one port resonator of the Love wave device illustrated in FIGS. 1 and 2. A broken line of FIG. 3 represents a frequency characteristic when the width dimension of the electrodes in the IDT area 13 is equal to the width dimension of the electrodes in the dummy area 14 (both the widths are equal to 40%), and a solid line of FIG. 3 represents a frequency characteristic when the width dimension of the electrodes in the IDT area 13 is equal to 40% and the width dimension of the electrodes in the dummy area 14 is equal to 50%. That is, the broken line of FIG. 3 represents the frequency characteristic of the elastic wave device of a comparative example, and the solid line represents the frequency characteristic of the elastic wave device of this embodiment. The solid line almost overlaps the broken line in this scale. FIG. 4 is an enlarged view of the area near of the resonance frequency illustrated in FIG. 3.

As illustrated in the solid-line characteristic of FIGS. 3 and 4, the loss near the resonance frequency can be reduced to a low value in a device in which the width of the electrodes of the dummy area 14 is set to a larger value (50%). Comparing the losses of both this embodiment and the comparative example at the resonance frequency, the loss of the device in which the electrode width in the dummy area 14 is equal to 40% and it is equal to the electrode width in the IDT area 13, which is equal to 0.18 dB. The loss of the device in which the electrode width in the dummy area 14 is larger than the electrode width in the IDT area 13 is equal to 0.15 dB. That is, the loss of the elastic wave device in which the electrode width in the dummy area 14 is larger is reduced to a lower value by about 20%. This loss reducing mechanism is illustrated in FIG. 5.

Figure 5:
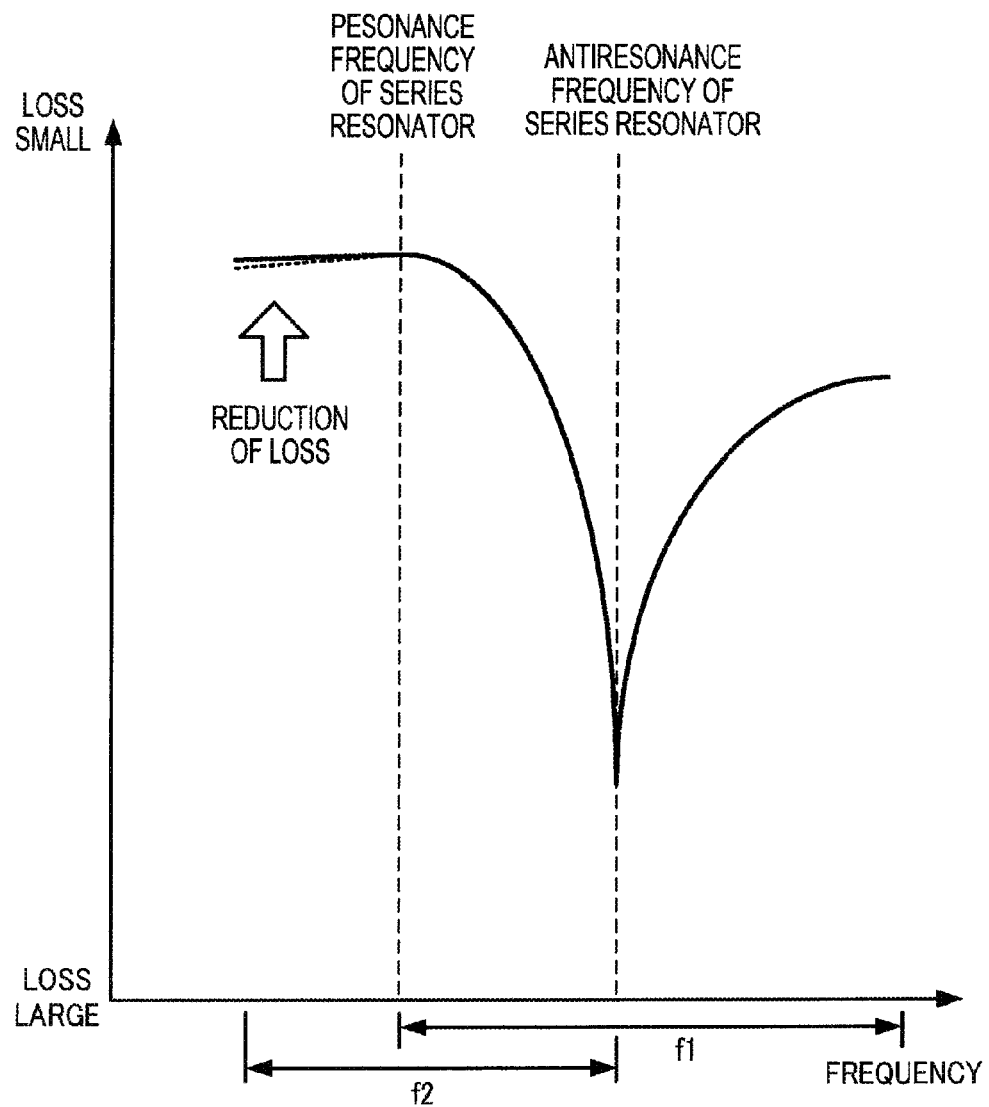
FIG. 5 is a characteristic diagram illustrating the relationship between the frequency characteristic and the loss.

FIG. 5 schematically illustrates the characteristic of the one port resonator. The abscissa axis represents the frequency, and the ordinate axis represents the loss. The loss increases as the position is shifted to the lower side of the ordinate axis, and decreases as the position is shifted to the higher side of the ordinate axis. The elastic wave device of this embodiment has a resonance frequency and an antiresonance frequency. A frequency range f1 of FIG. 5 is a stop band in the IDT area 13. A frequency range f2 represents a stop band in the dummy area 14 (the area having the electrodes each of which has a large line width).

Figure 6:
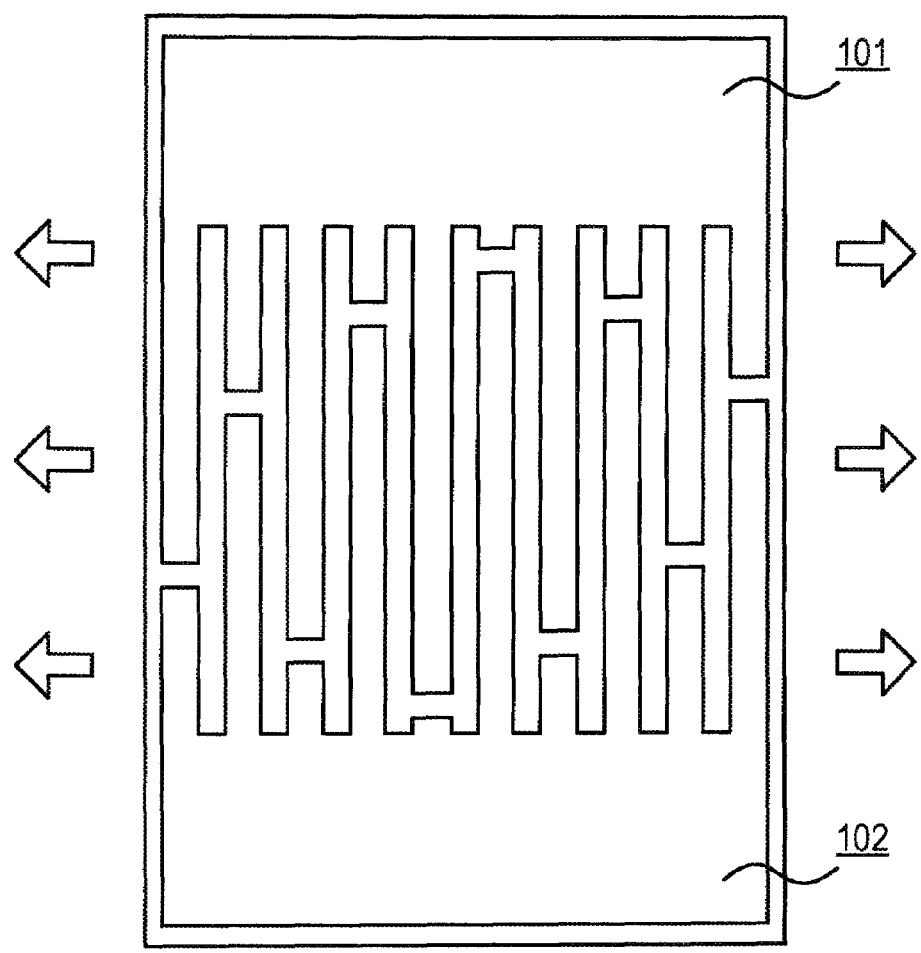
FIG. 6 is a plan view illustrating an elastic wave device as a comparative example.

Here, the "stop band" is the frequency range of elastic waves reflected from the electrodes, and the lower end of the stop band of the IDT area 13 corresponds to the resonance frequency of the IDT area 13. FIG. 6 is plan view illustrating the elastic wave device of the comparative example to describe the stop band, and the elastic wave device of FIG. 6 is constructed so that the electrodes of a first comb-shaped electrode 101 and a second comb-shaped electrode 102 are equal to one another in thickness. As illustrated in FIG. 6, the elastic waves of the frequencies out of the stop band are not reflected from the electrodes, but scattered and lost to the outside of the elastic wave device as indicated by arrows in FIG. 6. However, in the elastic wave device of this embodiment, the electrodes of the dummy area 14 are set to be larger in line width than the electrodes of the IDT area 13 as illustrated in FIG. 1, and thus the velocity of sound in the dummy area 14 is lower than that in the IDT area 13. As such, the stop band is shifted to the lower frequency side as a whole, as indicated by the frequency range f2 of FIG. 5. As a result, the lower frequency side enters the stop band, and the loss can be reduced near the resonance frequency as illustrated in FIG. 4.

Figure 7:
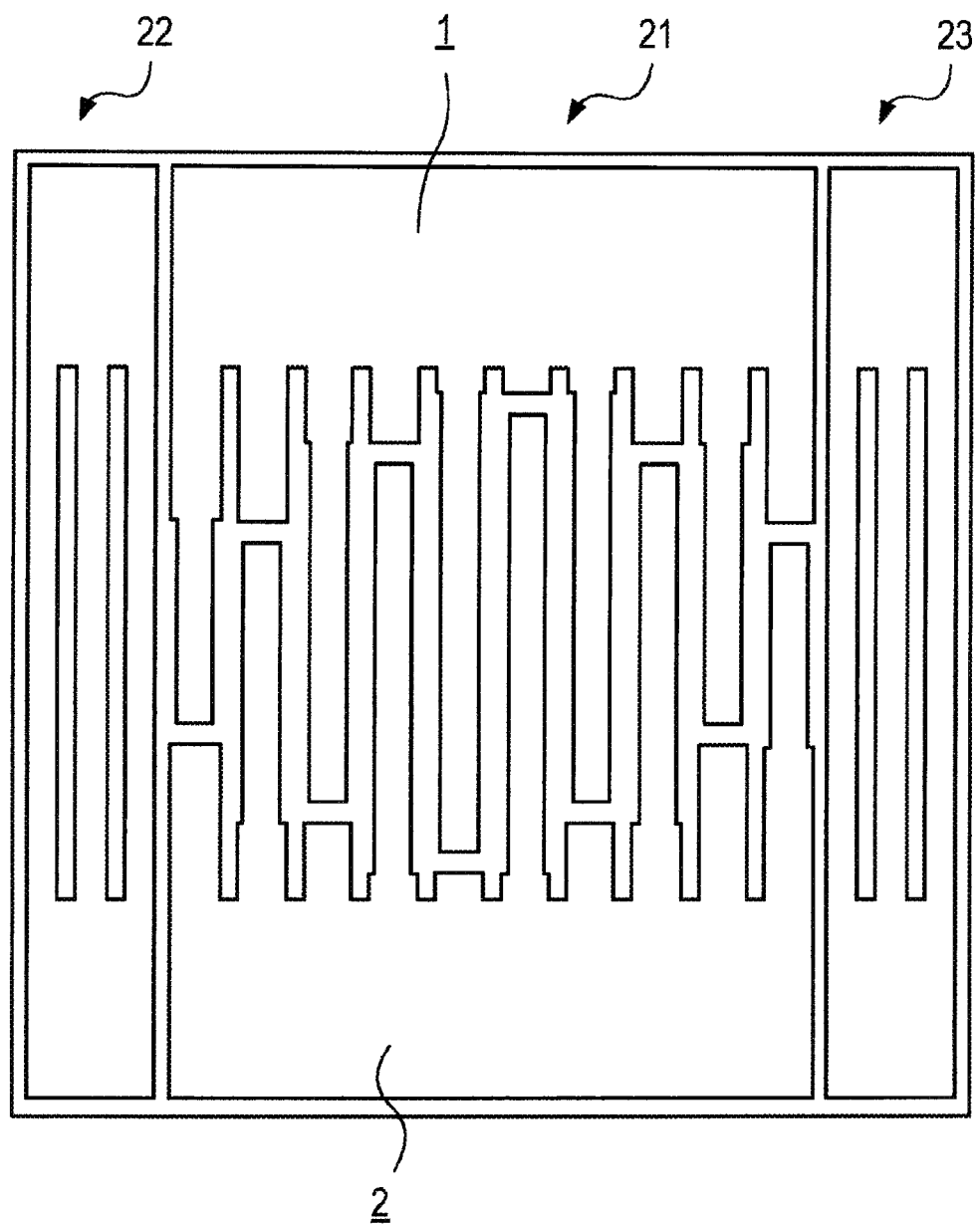
FIG. 7 is a plan view illustrating an application example of an elastic wave device according to the embodiment.

FIG. 7 illustrates an application example of the elastic wave device of this embodiment. The elastic wave device illustrated in FIG. 7 is further provided with reflectors 22 and 23 having a larger line width than the line width of at least the small-width portions of the comb-shaped electrode portion 21 (see the small-width portions 11a and 12a in FIG. 1) which are arranged at both the sides of the comb-shaped electrode portion 21 containing the first comb-shaped electrode 1 and the second comb-shaped electrode 2. With this construction, the elastic waves scattered and lost from the comb-shaped electrode portion 21 (the elastic waves scattered and lost in the direction of the arrows in FIG. 6) are reflected from the reflectors 22 and 23 and returned to the comb-shaped electrode portion 21 again, so that the loss can be reduced. Furthermore, while not illustrated, the same effect can be obtained even when the electrode width is not increased at the non-overlapping portions of the IDT electrode 13 and the line width of only the dummy electrode 14 is increased.

Figure 8:
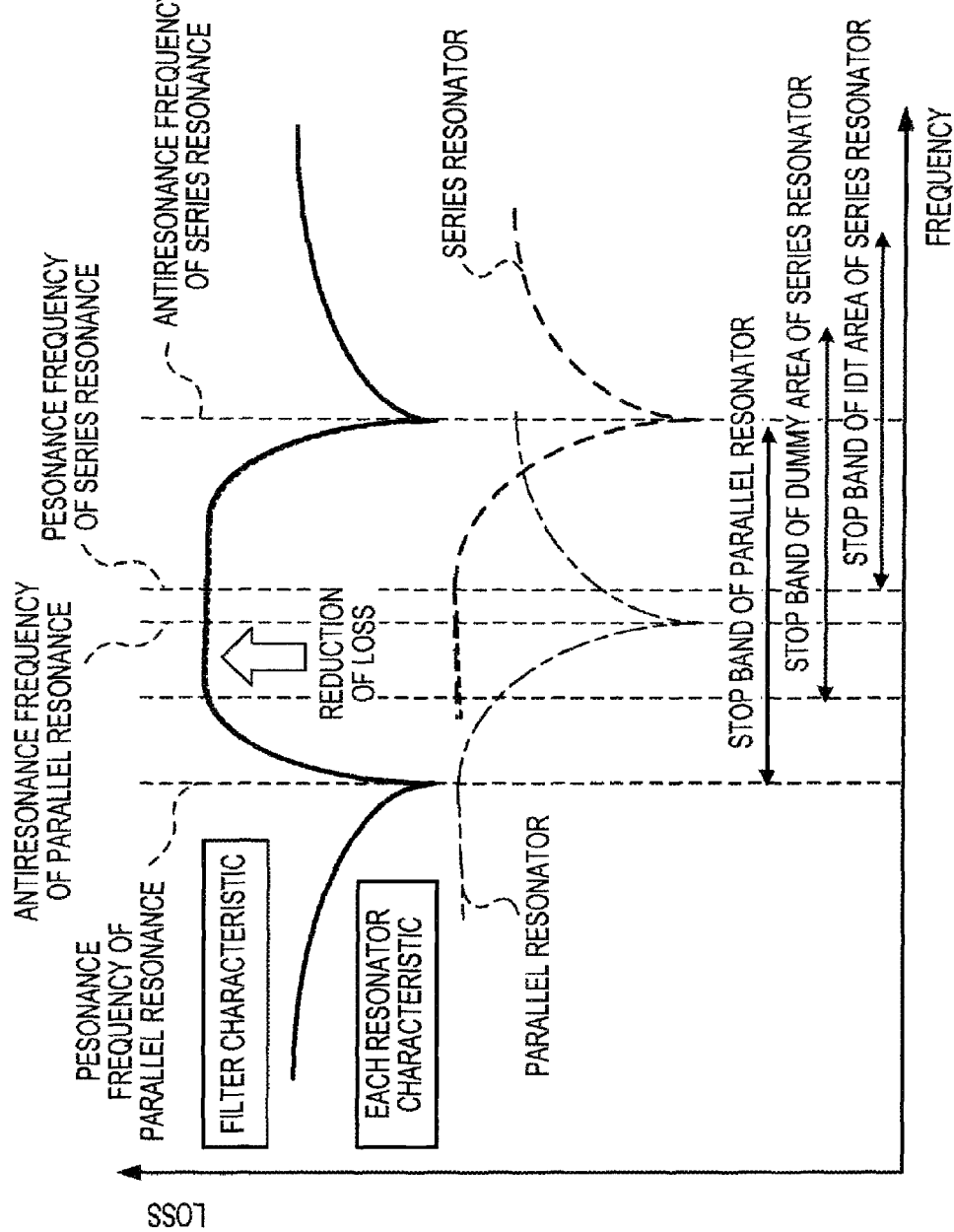
FIG. 8 is a characteristic diagram illustrating the frequency characteristic when the elastic wave device of the embodiment is applied to a ladder type filter.

FIG. 8 illustrates a mechanism of reducing the loss when the elastic wave device of this embodiment is applied to a ladder type filter. The ladder type filter (not illustrated) is constructed as follows. That is, elastic wave devices are connected to each other in series to form a series arm, and other elastic wave devices are connected to each other to form a parallel arm, and the parallel arm is connected to the series arm in parallel to form the ladder type filter. The elastic wave device connected to the series arm is called a "series resonator", and the elastic wave device connected to the parallel arm is called a "parallel resonator". As illustrated in FIG. 8, by applying the elastic wave device of this embodiment to the series resonator of the ladder type filter, the loss of the low-frequency portion of the pass band can be reduced.

Figure 9:
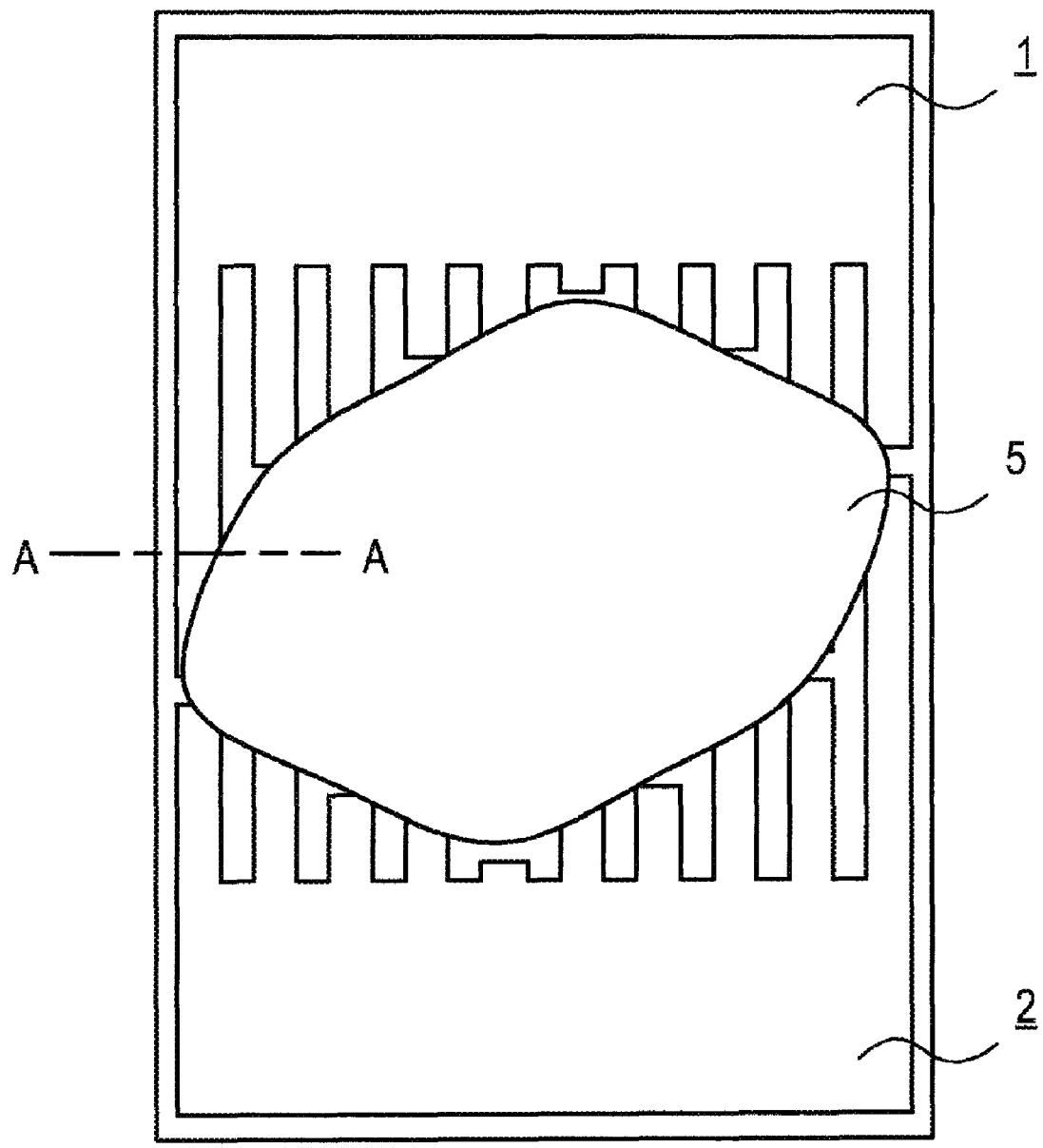
FIG. 9 is a plan view illustrating a first example of the elastic wave element in the embodiment.
Figure 10:
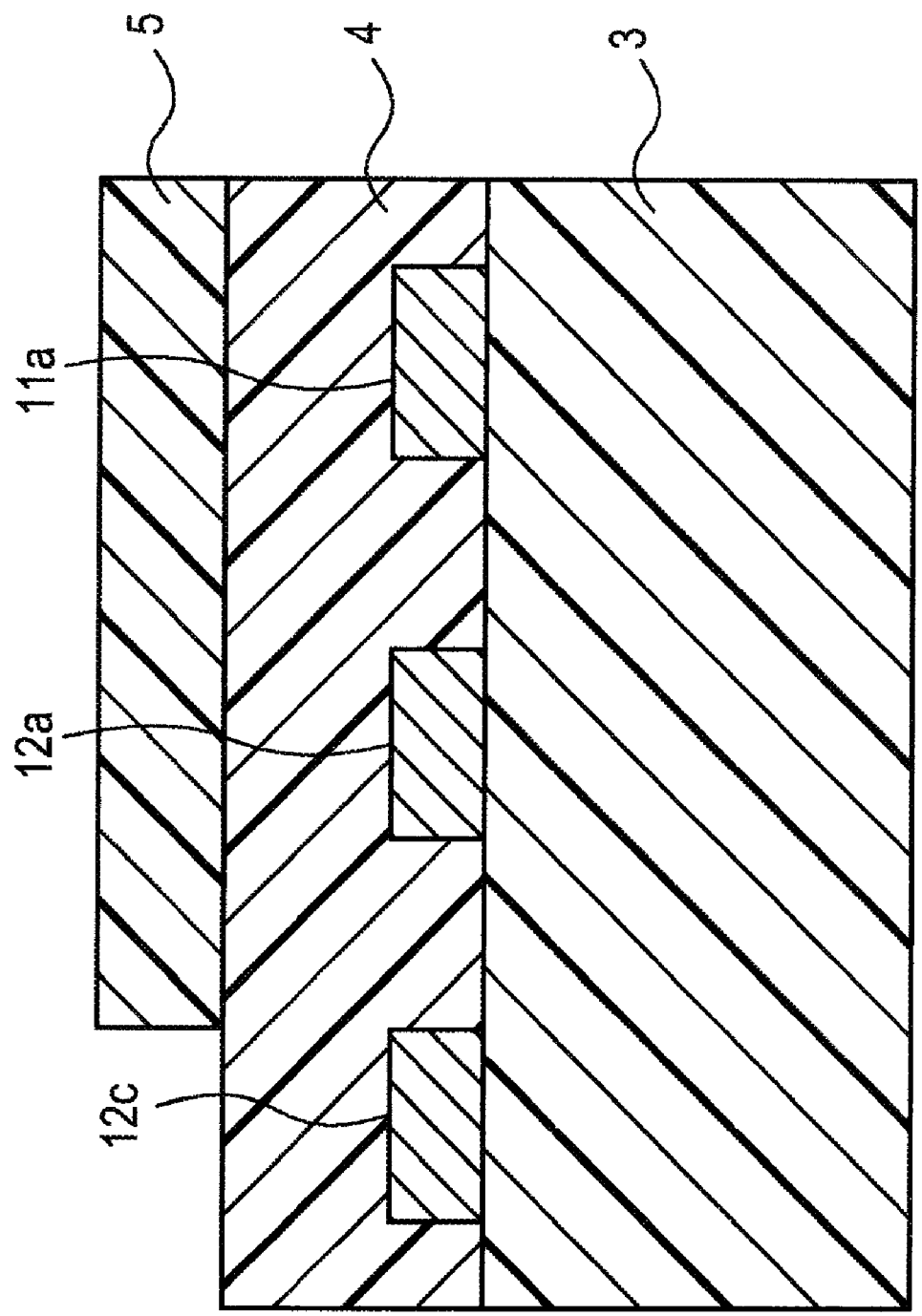
FIG. 10 is a overlap-sectional view of A-A portion of FIG. 9.

FIG. 9 is a plan view illustrating a first example of the elastic wave device of this embodiment. FIG. 10 is an overlap-sectional view of A-A portion of FIG. 9. In the elastic wave device illustrated in FIGS. 9 and 10, the respective electrodes of the first and second comb-shaped electrodes 1 and 2 are equal to one another in width. In the elastic wave device of FIGS. 9 and 10, a high sound velocity film 5 having a higher sound velocity than $SiO_2$ film 4 is formed on the $SiO_2$ film 4 of the IDT area of the Love wave device. With this construction, the sound velocity of the IDT area 13 is set to be higher than the sound velocity of the dummy area 14, so that the sound velocity of the dummy area 14 is set to be relatively lower. That is, the stop band is shifted to a lower frequency side. Silicon nitride (SiN), aluminum oxide(alumina) or the like may be used as the high sound velocity film 5.

Figure 11:
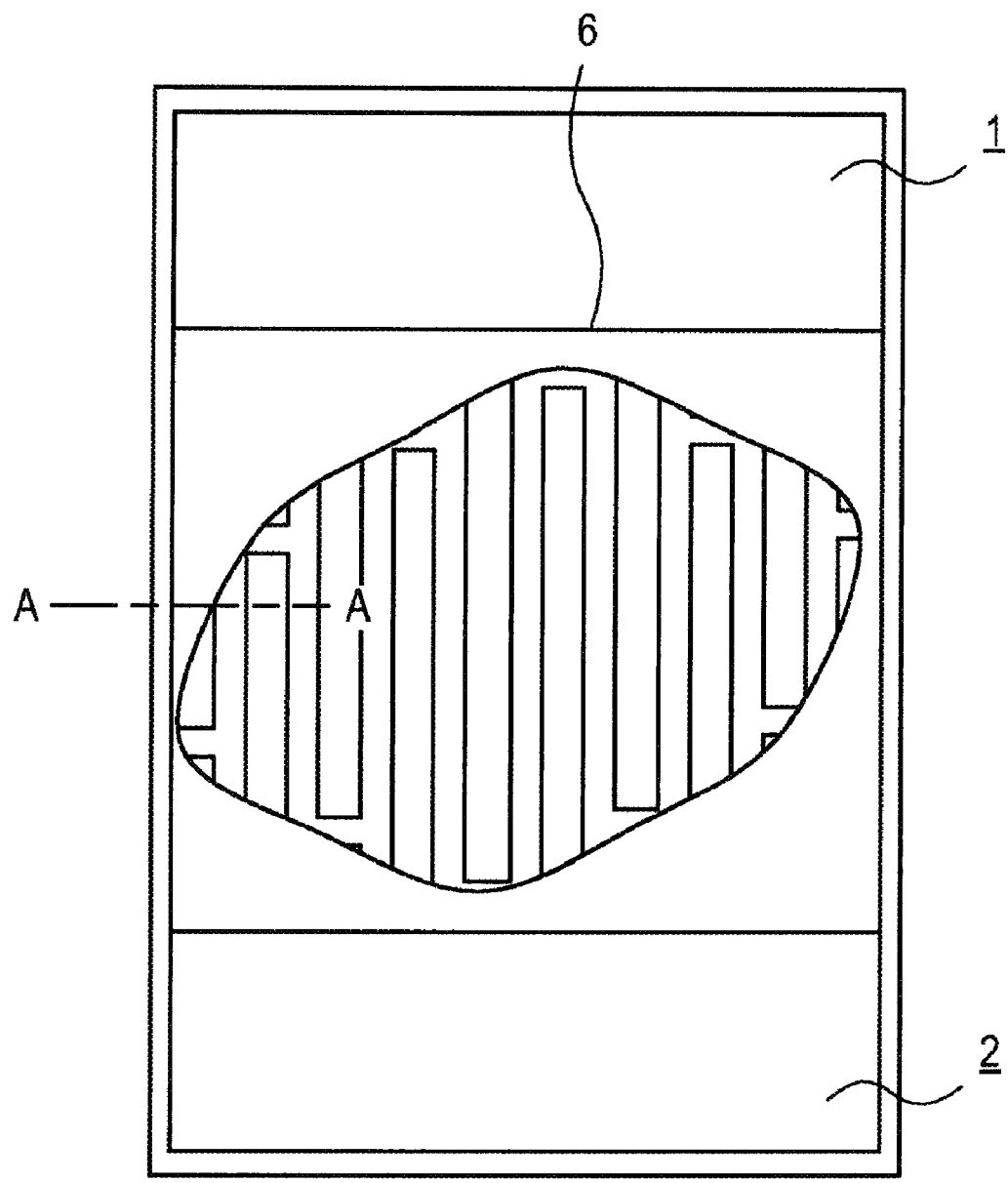
FIG. 11 is a plan view illustrating a second example of the elastic wave device in the embodiment.
Figure 12:
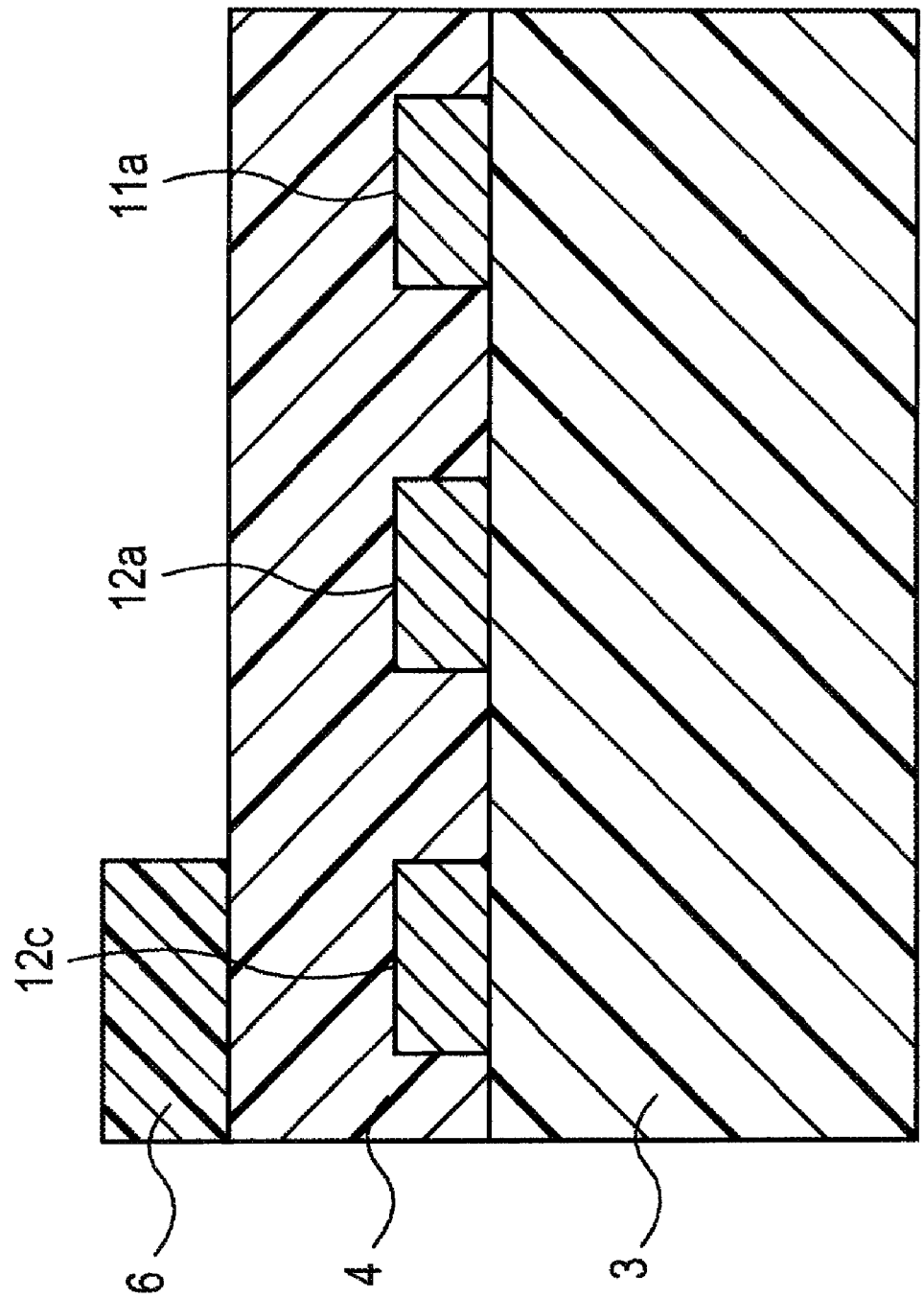
FIG. 12 is a overlap-sectional view of A-A portion in FIG. 11.

FIG. 11 is a plan view illustrating a second example of the elastic wave device according to this embodiment. FIG. 12 is an overlap-sectional view of A-A portion of FIG. 11. In the elastic wave device illustrated in FIGS. 11 and 12, the respective electrodes of the first and second comb-shaped electrodes 1 and 2 are equal to one another in width. Furthermore, in the elastic wave device illustrated in FIGS. 11 and 12, low sound velocity film 6 having a lower sound velocity than $SiO_2$ film 4 is formed on $SiO_2$ film 4 of the dummy area of the Love wave device. With this construction, the sound velocity of the dummy area 14 is set to be lower than the sound velocity of the IDT area 13, so that the sound velocity of the IDT area 13 is set to be relatively higher, that is, the stop band is shifted to a lower frequency side.

Figure 13:
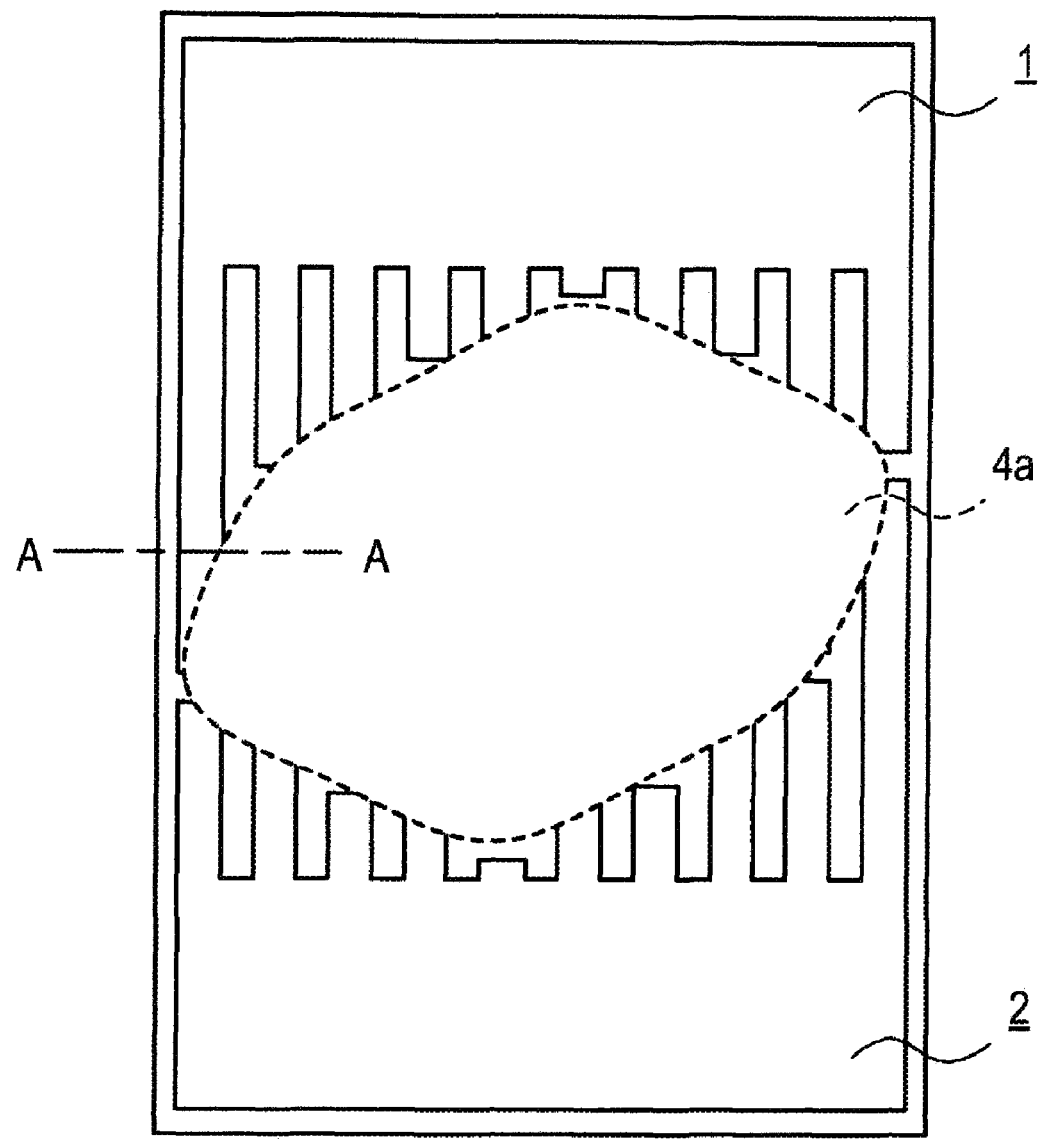
FIG. 13 is a plan view illustrating a third example of the elastic wave device in the embodiment.
Figure 14:
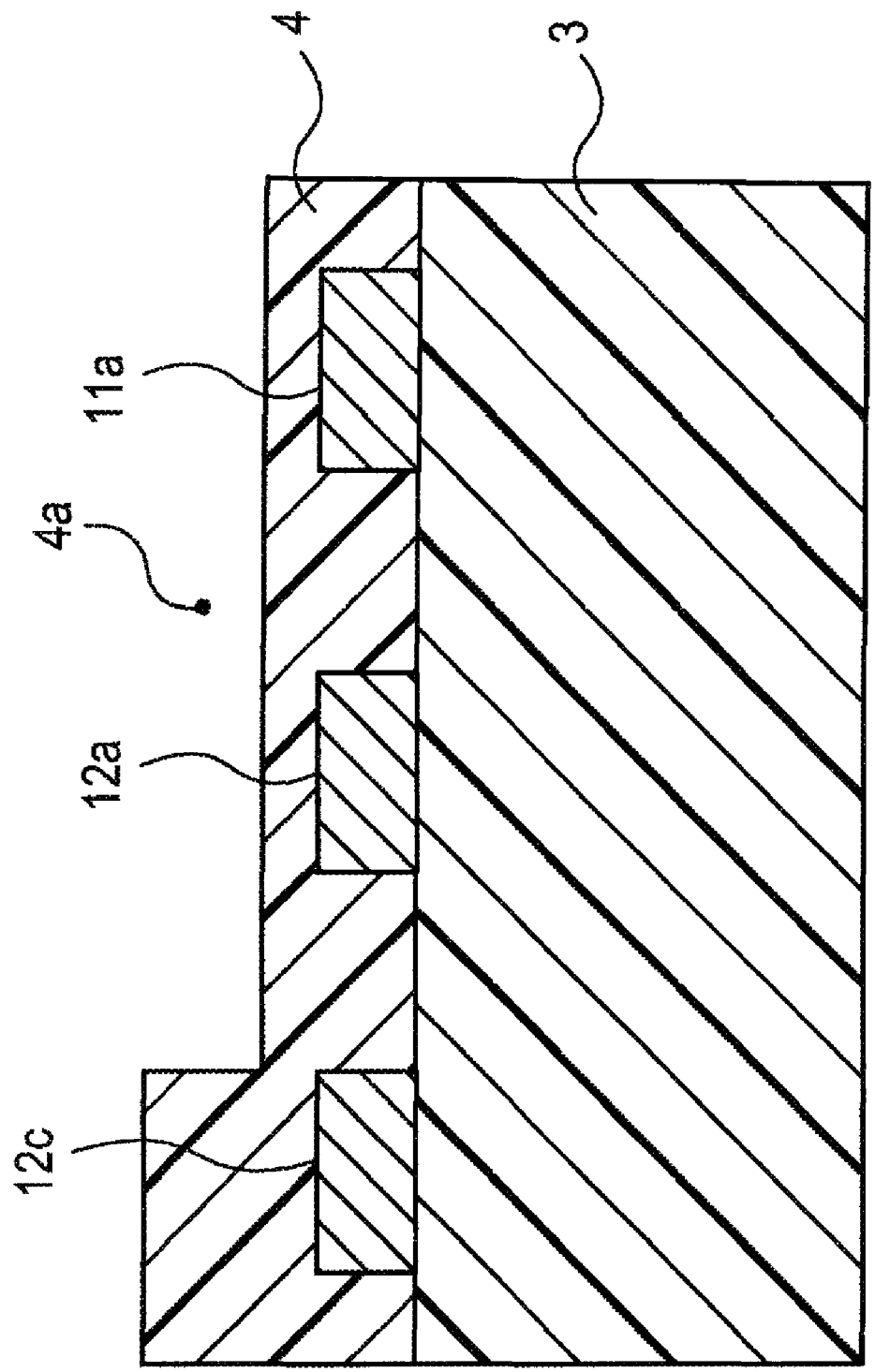
FIG. 14 is a overlap-sectional view of A-A portion in FIG. 13.

FIG. 13 is a plan view illustrating a third example of the elastic wave device of this embodiment. FIG. 14 is an overlap-sectional view of the A-A portion of FIG. 13. In the elastic wave device illustrated in FIGS. 13 and 14, the respective electrodes of the first and second comb-shaped electrodes 1 and 2 are equal to one another in width. The elastic wave device illustrated in FIGS. 13 and 14 has a high sound velocity area 4a having a small film thickness formed on $SiO_2$ film 4 of the IDT area of the Love wave device. With this construction, the sound velocity of the IDT area 13 is set to be higher than that of the dummy area 13, so that the sound velocity of the dummy area 14 is made relatively low, that is, the stop band is shifted to the low frequency side. In this construction, the high sound velocity film 5 and the low sound velocity film 6 are unnecessary and thus the cost can be reduced.

2. Duplexer

A duplexer is mounted in a mobile communication system (high frequency radio communication) such as a wireless LAN system or the like. The duplexer has a transmission function and a reception function for communication electronic waves or the like, and is used in a radio device in which the frequencies of a transmission signal and a reception signal are different from each other.

Figure 15:
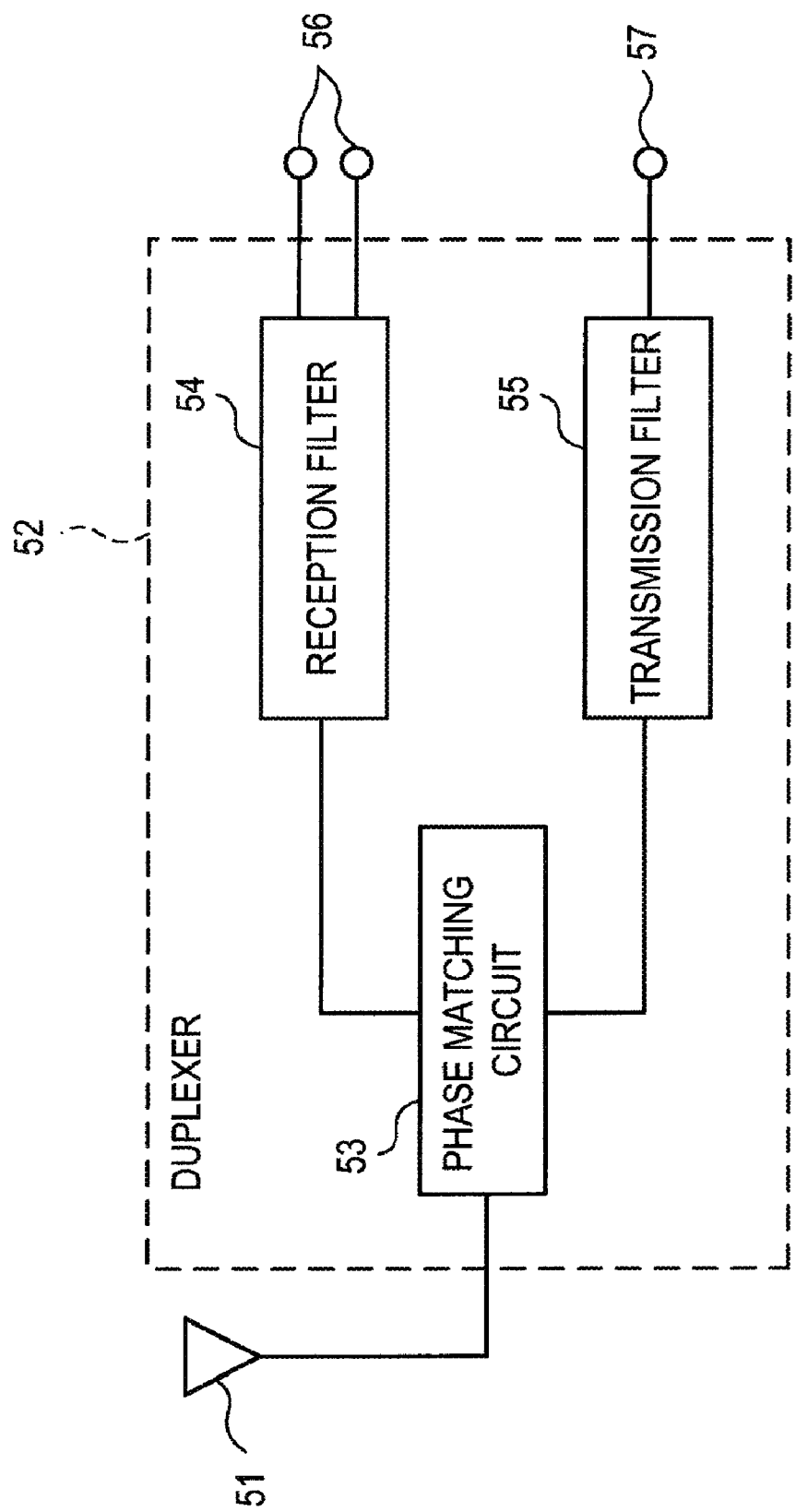
FIG. 15 is a block diagram of a duplexer.

FIG. 15 is a duplexer having an elastic wave device according to this embodiment. The duplexer 52 has a phase matching circuit 53, a reception filter 54 and a transmission filter 55. The phase matching circuit 53 is a device for adjusting the phase of impedance of the reception filter 54 to prevent a transmission signal output from the transmission filter 55 from flowing into the reception filter 54 side. An antenna 51 is connected to the phase matching circuit 53. The reception filter 54 is a band pass filter for passing therethrough only a reception signal having a reception frequency band outside of reception signals input through the antenna 51. Furthermore, an output terminal 56 is connected to the reception filter 54. The transmission filter 55 is a band pass filter for passing therethrough only a transmission signal having a transmission frequency band outside of transmission signals input through an input terminal 57. An input terminal 57 is connected to the transmission filter 55. Here, the reception filter 54 and the transmission filter 55 contain the elastic wave device according to this embodiment.

As described above, a duplexer having little loss and an excellent filter characteristic can be implemented by providing the elastic wave device of this embodiment to the reception filter 54 and the transmission filter 55.

3. Communication Module

Figure 16:
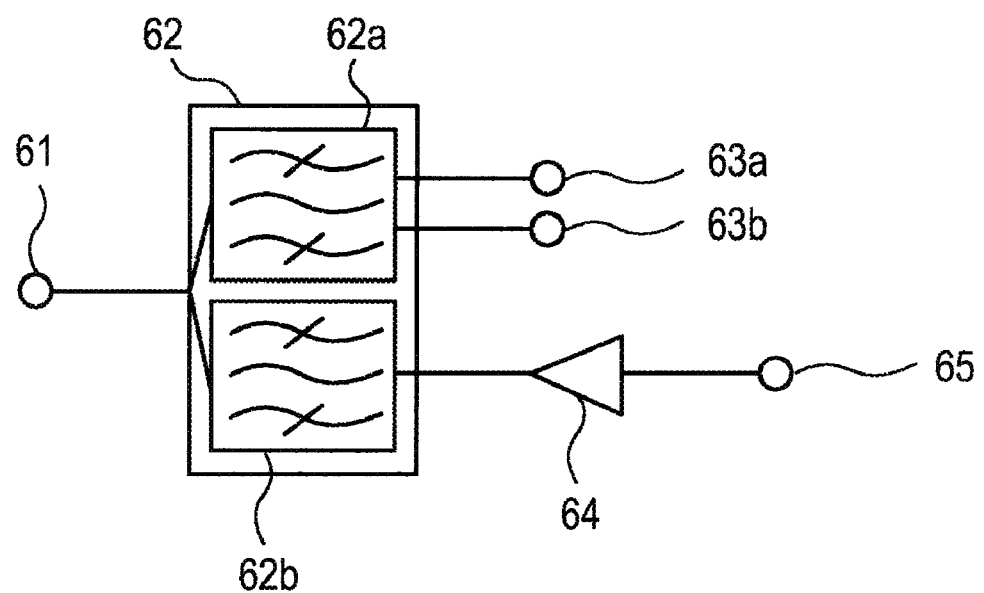
FIG. 16 is a block diagram of a communication module.

FIG. 16 illustrates an example of a communication module having the elastic wave device of this embodiment or a duplexer illustrated in FIG. 15. As illustrated in FIG. 16, the duplexer 62 has a reception filter 62a and a transmission filter 62b. Reception terminals 63a and 63b corresponding to balance output are connected to the reception filter 62a. The transmission filter 62b is connected to a transmission terminal 65 through a power amplifier 64. Here, the reception filter 62a and the transmission filter 62b contain the elastic wave device or the duplexer according to this embodiment.

When a receiving operation is carried out, the reception filter 62a passes therethrough only a reception signal having a reception frequency band outside of reception signals input through the antenna terminal 61, and outputs the reception signal from the reception terminals 63a and 63b to the outside. When a transmitting operation is carried out, the transmission filter 62b passes only a transmission signal which is input from the transmission terminal 65 and amplified by the power amplifier 64, and outputs the transmission signal from the antenna terminal 61 to the outside.

As described above, the elastic wave device or the duplexer of this embodiment is provided to the reception filter 62a and the transmission filter 62b of the communication module, thereby implementing a communication module which has little loss and an excellent filter characteristic.

The communication module illustrated in FIG. 16 is an example, and the same effect can be also obtained when the elastic wave device of this embodiment is mounted in another type of communication module.

4. Communication Device

Figure 17:
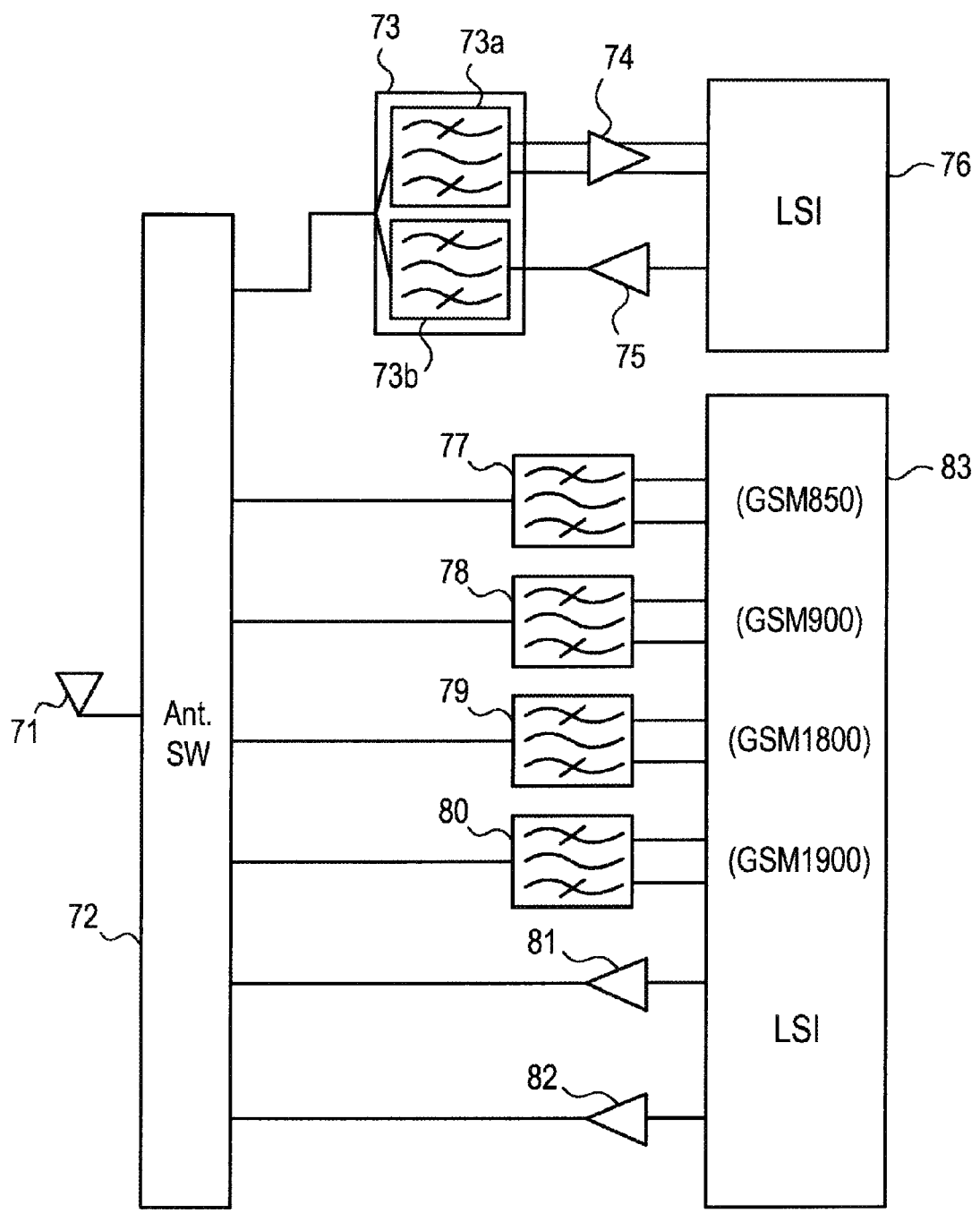
FIG. 17 is a block diagram of a communication device.

FIG. 17 is an RF block of a cellular phone terminal as an example of a communication device having the elastic wave device, the duplexer or the communication module according to this embodiment. FIG. 17 illustrates a cellular phone terminal adaptable to a GSM (Global System for Mobile Communications) communication system and a W-CDMA (Wideband Code Division Multiple Access) communication system. The GSM communication system of this embodiment is adapted to 850 MHZ band, 950 MHz band, 1.8 GHz band and 1.9 GHz band. The cellular phone terminal has a microphone, a speaker, a liquid crystal display, etc. in addition to the construction illustrated in FIG. 17. Here, reception filters 73a, 77, 78, 79, 80 and the transmission filter 73b contain the elastic wave device and the duplexer of this embodiment.

The reception signal input through the antenna 71 selects LSI as an operation target in an antenna switch circuit 72 in accordance with whether the communication system is W-CDMA or GSM. When the input reception signal is adapted to the W-CDMA communication system, the switching operation is carried out so that the reception signal is output to the duplexer 73. The reception signal input to the duplexer 73 is limited to the reception frequency band in the reception filter 73a, and a balance type reception signal is output to LNA 74. LNA 74 amplifies the input reception signal, and output the amplified reception signal to LSI 76. In LSI 76, the process of demodulating the input reception signal to an audio signal is executed. Additionally, the operation of each part of the cellular phone terminal is controlled.

On the other hand, when a signal is transmitted, LSI 76 generates a transmission signal. The generated transmission signal is amplified in the power amplifier 75 and then input to the transmission filter 73b. The transmission filter 73b passes therethrough only the signal of the transmission frequency band outside of the input transmission signals. The transmission signal output from the transmission filter 73b is output from the antenna 71 through the antenna switch circuit 72 to the outside.

When the input reception signal is adapted to the GSM communication system, the antenna switch circuit 72 selects any one of the reception filters 77 to 80 in accordance with the frequency band, and outputs the reception signal. The reception signal which is subjected to band limiting by any one of the reception filters 77 to 80 which is input to LSI 83. LSI 83 executes the process of demodulating the input reception signal to the audio signal and also controls the operation of each part in the cellular phone terminal. When a signal is transmitted, LSI 83 generates a transmission signal. The generated transmission signal is amplified by the power amplifier 81 or 82, and the amplified transmission signal is output from the antenna 71 through the antenna switch circuit to the outside.

As described above, by providing the elastic wave device of this embodiment to the communication device, a communication device having little loss and an excellent filter characteristic can be implemented.

5. Effect of this Embodiment and Others

According to this embodiment, the sound velocity in the dummy area 14 is set to be lower than the sound velocity in the IDT area 13, whereby the stop band of the elastic wave device can be moved to a lower frequency side and the loss at the resonance frequency and the antiresonance frequency can be reduced. Furthermore, by mounting the elastic wave device as described above in the filter, the communication module or the communication device, a device having little loss and an excellent filter characteristic can be implemented.

In this embodiment, the examples of the Love wave device have been described. However, this embodiment is not limited to the Love wave device, but it may be applied to any device insofar as the apodizing weighting is applied to the comb-shaped electrodes. For example, this embodiment may be applied to an elastic boundary wave device.

In this embodiment, there is some portion at which the overlap width of the IDT area 13 of the comb-shaped electrodes 1 and 2 varies, however, the overlap width may be fixed in all the area.

Furthermore, in this embodiment, one of the high sound velocity film 5 and the low sound velocity film 6 is provided. However, the high sound velocity film 5 may be provided to the IDT area 13 while the low sound velocity film 6 is provided to the dummy area 14. That is, in this embodiment, both the high sound velocity film 5 and the low sound velocity film 6 may be provided. Furthermore, in this embodiment, a high sound velocity area 4a may be provided, and the low sound velocity film may be provided to the dummy area 14.

The piezoelectric substrate 3 of this embodiment is an example of the piezoelectric substrate. The first comb-shaped electrode 1, the second comb-shaped electrode 2 and the comb-shaped electrode 21 of this embodiment are examples of the comb-shaped electrode. The IDT area 13 of this embodiment is an example of the overlapping area. The dummy electrode 14 of this embodiment is an example of the non-overlapping area. The high sound velocity film 5 of this embodiment is an example of the film which is formed of a material having a high sound velocity. The low sound velocity film 6 of this embodiment is an example of the film which is formed of material having a low sound velocity. The $SiO_2$ film 4 of this embodiment is an example of the dielectric layer.

This embodiment has been described above in detail. However, this embodiment is not limited to a specific embodiment, and various modifications and alterations may be made without departing from the subject matter described in claims.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alternatives could be made hereto without departing from the spirit and scope of the invention.

The invention claimed is:

1. An elastic wave device comprising:
   a piezoelectric substrate;
   comb-shaped electrodes having teeth electrodes facing each other on the piezoelectric substrate;
   a non-overlapping area in which the teeth electrodes of the comb-shaped electrodes do not overlap each other;
   an overlapping area in which the teeth electrodes overlap each other and the velocity of sound is higher than that in the non-overlapping area; and
   a dielectric layer formed on the comb-shaped electrodes, wherein the dielectric layer comprises silicon oxide ($SiO_2$), and a portion thereof that covers the non-overlapping area of the comb-shaped electrodes is larger in thickness than a portion thereof that covers the overlapping area,
   wherein the dielectric layer has a portion thereof that covers the comb-shaped electrodes, wherein the portion is larger in thickness than the comb-shaped electrodes.

2. The elastic wave device according to claim 1, wherein the comb-shaped electrodes have portions which are different in overlap width.

3. The elastic wave device according to claim 1, wherein the electrode width in the non-overlapping area is larger than the electrode width in the overlapping area.

4. The elastic wave device according to claim 1, wherein a film comprising a material having a sound velocity higher than that of $SiO_2$ film is formed on the overlapping area of the comb-shaped electrodes.

5. The elastic wave device according to claim 1, wherein a film comprising a material having a sound velocity lower than that of $SiO_2$ film is formed on the non-overlapping area of the comb-shaped electrodes.

6. An elastic wave device comprising:
   a piezoelectric substrate;
   comb-shaped electrodes formed on the piezoelectric substrate;
   a reflector adjacent to the comb-shaped electrodes, having a portion in which an overlap width of the comb-shaped electrodes varies, the comb-shaped electrodes have a non-overlapping area in which adjacent electrodes do not overlap each other and an overlapping area in which adjacent electrodes overlap each other, and wherein the reflector has an area having a sound velocity that is lower than the sound velocity of the overlapping area of the comb-shaped electrodes; and
   a dielectric layer formed on the comb-shaped electrodes, wherein the dielectric layer comprises silicon oxide ($SiO_2$), and a portion thereof that covers the non-overlapping area of the comb-shaped electrodes is larger in thickness than a portion thereof that covers the overlapping area,
   wherein the dielectric layer has a portion thereof that covers the comb-shaped electrodes, wherein the portion is larger in thickness than the comb-shaped electrodes.

7. The elastic wave device according to claim 6, wherein the elastic wave device comprises a Love wave device.

8. The elastic wave device according to claim 7, wherein the Love wave device includes a piezoelectric substrate comprising a lithium niobate ($LiNbO_3$) substrate.

9. The elastic wave device according to claim 6, wherein the elastic wave device comprises a boundary wave device.

10. A filter equipped with an elastic wave device comprising:
    a piezoelectric substrate;
    comb-shaped electrodes having teeth electrodes facing each other on the piezoelectric substrate;
    a non-overlapping area in which the teeth electrodes of the comb-shaped electrodes do not overlap each other;
    an overlapping area in which the teeth electrodes overlap each other and the velocity of sound is higher than in the non-overlapping area; and
    a dielectric layer formed on the comb-shaped electrodes, wherein the dielectric layer comprises silicon oxide ($SiO_2$), and a portion thereof that covers the non-overlapping area of the comb-shaped electrodes is larger in thickness than a portion thereof that covers the overlapping area,
    wherein the dielectric layer has a portion thereof that covers the comb-shaped electrodes, wherein the portion is larger in thickness than the comb-shaped electrodes.

11. A communication module having a filter equipped with an elastic wave device comprising:
    a piezoelectric substrate;
    comb-shaped electrodes having teeth electrodes facing each other on the piezoelectric substrate;
    a non-overlapping area in which the teeth electrodes of the comb-shaped electrodes do not overlap each other;
    an overlapping area in which the teeth electrodes overlap each other and the velocity of sound is higher than that in the non-overlapping area; and
    a dielectric layer formed on the comb-shaped electrodes, wherein the dielectric layer comprises silicon oxide ($SiO_2$), and a portion thereof that covers the non-overlapping area of the comb-shaped electrodes is larger in thickness than a portion thereof that covers the overlapping area,
    wherein the dielectric layer has a portion thereof that covers the comb-shaped electrodes, wherein the portion is larger in thickness than the comb-shaped electrodes.

12. A communication device including a communication module having a filter equipped with an elastic wave device comprising:
    a piezoelectric substrate;
    comb-shaped electrodes having teeth electrodes facing each other on the piezoelectric substrate;
    a non-overlapping area in which the teeth electrodes of the comb-shaped electrodes do not overlap each other;
    an overlapping area in which the teeth electrodes overlap each other and the velocity of sound is higher than in the non-overlapping area; and
    a dielectric layer formed on the comb-shaped electrodes, wherein the dielectric layer comprises silicon oxide ($SiO_2$), and a portion thereof that covers the non-overlapping area of the comb-shaped electrodes is larger in thickness than a portion thereof that covers the overlapping area,
    wherein the dielectric layer has a portion thereof that covers the comb-shaped electrodes, wherein the portion is larger in thickness than the comb-shaped electrodes.

* * * * *